(12) United States Patent
Colgan et al.

(10) Patent No.: US 6,774,482 B2
(45) Date of Patent: Aug. 10, 2004

(54) CHIP COOLING

(75) Inventors: Evan George Colgan, Chestnut Ridge, NY (US); John Harold Magerlein, Yorktown Heights, NY (US); Robert Luke Wisnieff, Ridgefield, CT (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/330,742

(22) Filed: Dec. 27, 2002

(65) Prior Publication Data

US 2004/0124525 A1 Jul. 1, 2004

(51) Int. Cl.[7] ............................................. H01L 23/34
(52) U.S. Cl. .................... 257/712; 257/700; 257/707; 257/713; 257/720; 257/730
(58) Field of Search ............................ 257/712, 700, 257/707, 713, 720, 730

(56) References Cited

U.S. PATENT DOCUMENTS

| | | | | |
|---|---|---|---|---|
| 3,436,818 A | * | 4/1969 | Merrin et al. ................. 257/778 |
| 4,500,945 A | | 2/1985 | Lipschutz .................... 361/386 |
| 4,823,863 A | | 4/1989 | Nakajima et al. ............. 165/80 |
| 5,023,695 A | | 6/1991 | Umezawa et al. ............ 357/82 |
| 5,098,609 A | | 3/1992 | Iruvanti et al. .............. 252/511 |
| 5,177,667 A | | 1/1993 | Graham et al. .............. 361/385 |
| 5,239,200 A | | 8/1993 | Messina et al. .............. 257/714 |
| 5,298,791 A | | 3/1994 | Liberty et al. ............... 257/707 |
| 5,345,107 A | | 9/1994 | Daikoku et al. ............. 257/717 |
| 5,635,762 A | * | 6/1997 | Gamand ....................... 257/728 |
| 5,705,855 A | * | 1/1998 | Carson et al. ............... 257/737 |
| 5,793,117 A | * | 8/1998 | Shimada et al. ............. 257/780 |
| 5,825,087 A | | 10/1998 | Iruvanti et al. .............. 257/707 |
| 5,898,223 A | * | 4/1999 | Frye et al. ................... 257/777 |
| 6,091,603 A | | 7/2000 | Daves et al. ................. 361/704 |
| 6,188,138 B1 | * | 2/2001 | Bodo et al. .................. 257/778 |
| 6,255,139 B1 | | 7/2001 | Edwards et al. ............. 438/122 |
| 6,271,111 B1 | * | 8/2001 | Farouq et al. ............... 438/614 |
| 6,320,254 B1 | * | 11/2001 | Liou et al. ................... 257/688 |
| 6,358,833 B1 | * | 3/2002 | Akram et al. ................ 438/613 |
| 6,399,182 B1 | | 6/2002 | Rubel et al. ................. 428/167 |
| 6,599,822 B1 | * | 7/2003 | Akram ......................... 438/614 |
| 6,617,687 B2 | * | 9/2003 | Akram et al. ................ 257/737 |

* cited by examiner

Primary Examiner—Jasmine Clark
(74) Attorney, Agent, or Firm—Judith D. Olsen, Esq.; Robert M. Trepp, Esq.

(57) ABSTRACT

In an integrated circuit structure, such as in an MCM or in an SCM, a particulate thermally conductive conformable material, such as a thermal paste, is applied between a heat-generating chip and a cooling plate. Modification of the microstructure of at least one of the two nominally parallel surfaces which are in contact with the material is provided in a discrete pattern of sloped recesses. The largest particles in the material preferentially migrate downward into the recesses. The average thickness of the conductive paste is reduced to below the diameter of the largest particles dispersed in the material, providing improved cooling.

27 Claims, 19 Drawing Sheets

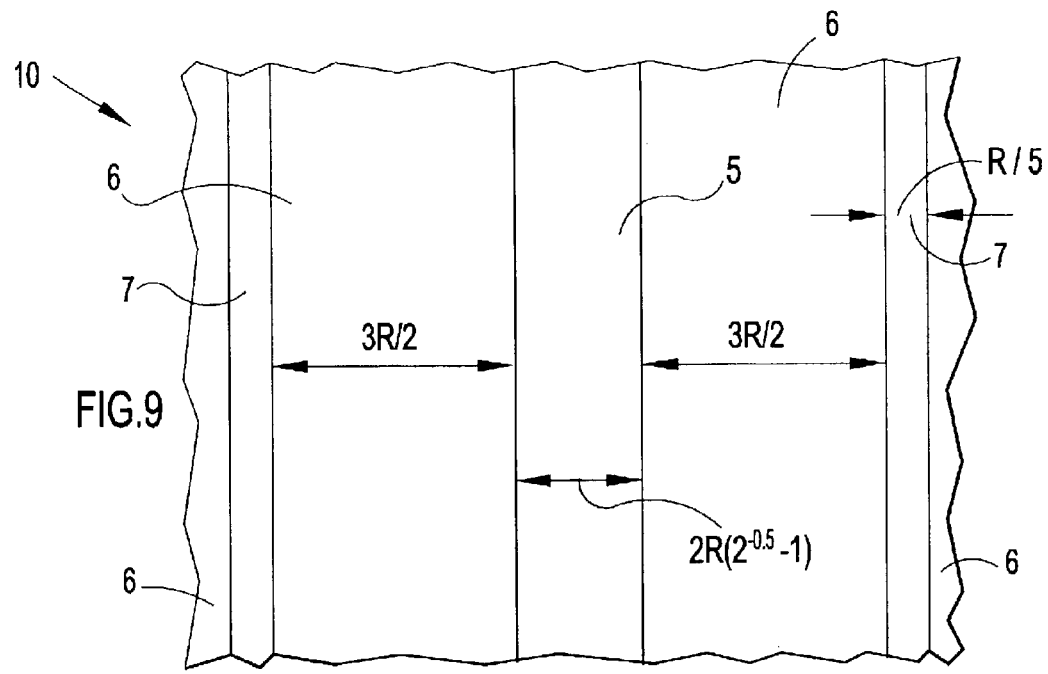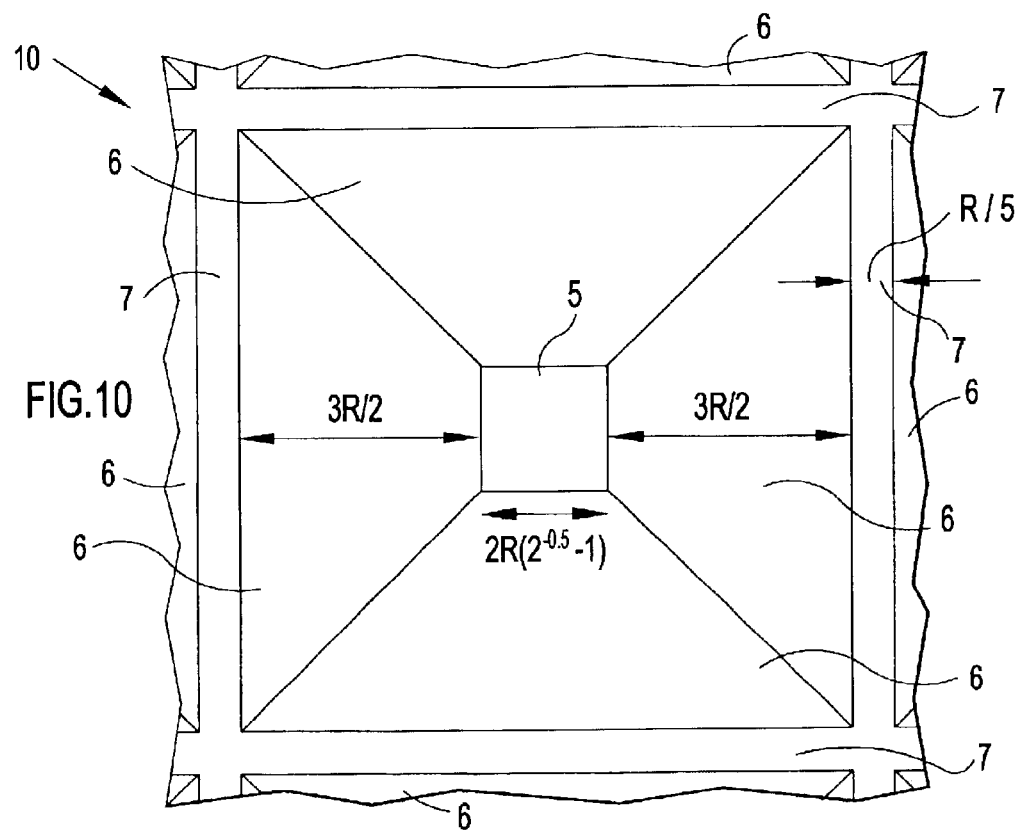

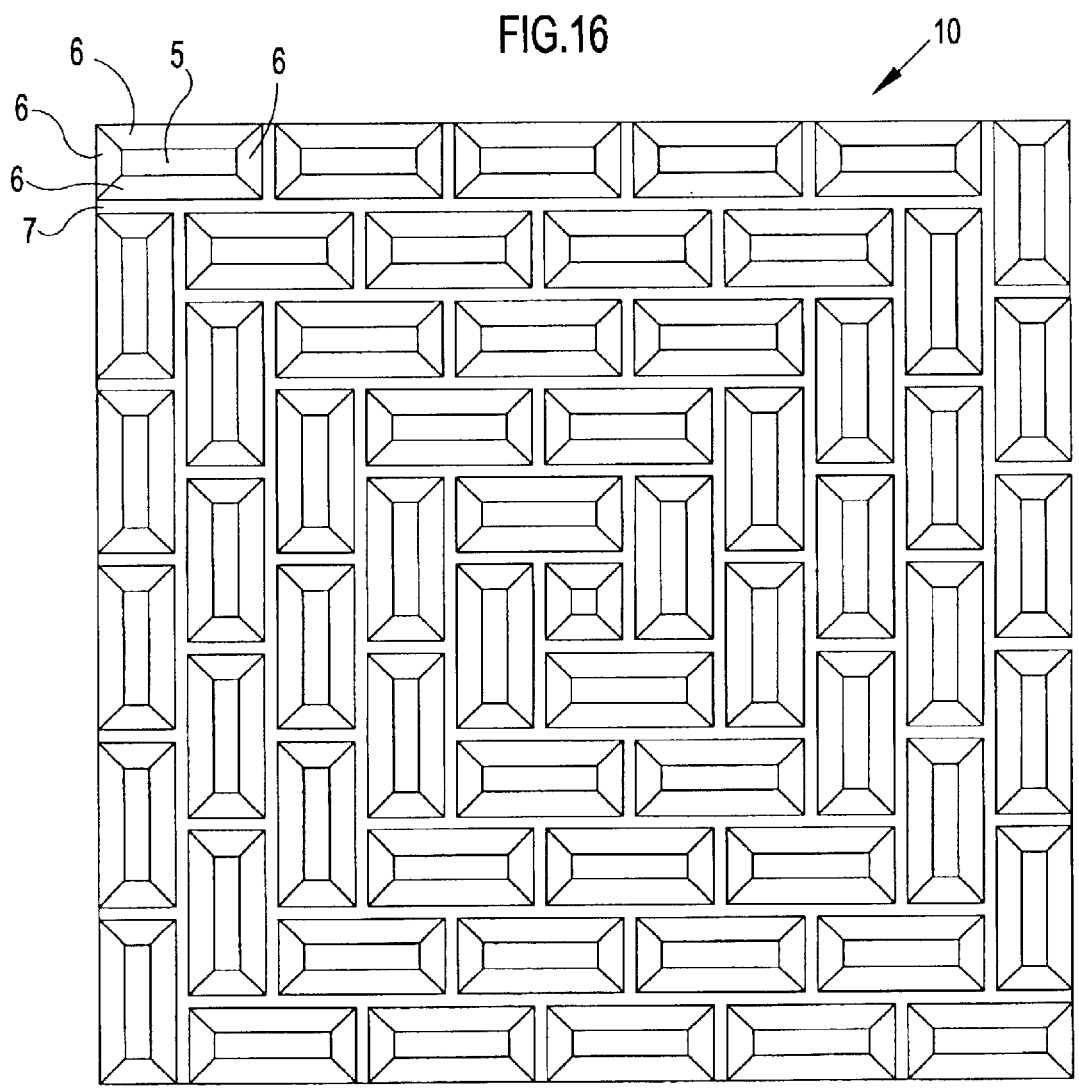

CHIP COOLING

FIELD OF THE INVENTION

The present invention relates to cooling within integrated circuit (IC) packaging structures. More particularly, the present invention is directed to cooling of integrated circuit chips using a thermally conductive conformable material.

BACKGROUND OF THE INVENTION

As heat is generated during the functioning of integrated circuit chips (ICs), the thermal resistance to the heat sink must be as small as possible so that the operating temperature of the chip is low enough to assure the continued reliable operation of the device. The problem of heat removal becomes ever more difficult as chip geometries are scaled down and operating speeds are increased, resulting in increased power density. The ability to adequately cool the chips is therefore a limiting factor in the further increase of system performance. Multiple terms are used in the art to describe the elements of the package which are used to remove heat, including heat sink, heat spreader, cooling plate, and heat transfer surface. In an array of ICs mounted on a substrate such as a mutichip module (MCM), special cooling difficulties are presented. In an MCM, the chips may be mounted very close together and nearly cover the whole top surface of the MCM. With such an arrangement, it may not be possible to use a heat spreader bonded directly to the back surface of the chips, as is sometimes used for isolated chips to reduce the heat flux (power/unit area, i.e. $W/cm^2$).

A common technique for removing heat from high-power ICs makes use of a cooling plate or heat sink which is thermally attached to the chip using a thermally conductive material such as a thermal paste or thermal grease. Heat is removed from the cooling plate or heat sink by methods such as forced air cooling or circulating liquid coolants. The term cooling plate will be used generically herein to refer to either a heat sink or a cooling plate. In heat removal techniques, it is critical to minimize the thermal resistance between the chip and the cooling plate or heat sink. The present invention is directed to reducing this thermal resistance.

Various approaches are set forth in the art to achieve cooling of ICs mounted on substrates. For example in U.S. Pat. Nos. 5,239,200 issued Aug. 24, 1993 to Messina et al., in U.S. Pat. No. 5,177,667 issued Jan. 5, 1993 to Graham and Moran, and in U.S. Pat. No. 4,500,945 issued Feb. 19, 1985 to Lipschutz, each of which is assigned to the present assignee, the use of circulating liquid or gas coolant is described. U.S. Pat. No. 5,023,695 issued Jun. 11, 1991 to Umezawa et al., describes the use of a circulating cooling fluid in conjunction with a cooling plate having cut cavities. Circulating fluid coolants or forced air cooling are required to remove heat from the surface of the external module, which is also referred to as a heat sink or cooling plate. The present invention is directed to reducing the thermal resistance between the chip within the package, whether the package is an MCM or an SCM, and the external module surface.

A thermally conductive paste or similar conformable compliant thermally conductive material is typically placed between the IC chip and the cooling plate or heat sink. Thermally conductive paste typically comprises thermally conductive particles having a distribution of sizes dispersed within a binder material or matrix, such as the paste described in U.S. Pat. No. 5,098,609 issued Mar. 24, 1992 to Iruvanti et al. In the '609 patent, paste is applied between the top of the IC mounted on the substrate and the lower flat surface of a cooling plate facing the substrate. The type of paste described in the '609 patent can be used in the present invention, as can other thermally conductive pastes used in the art or other compliant particle-based conformable materials. Typical particle-based materials include those having a wax matrix, commonly known as phase-change materials, those having a silicone-based matrix, and dry particle lubricants such as graphite and metal powders.

When applying a thermal paste between the back of a chip which is electrically attached to a substrate and the lower surface of a cooling plate, the paste layer must be made as thin as possible in order to reduce the thermal resistance through the paste layer. The paste must also be compliant, or flexible, maintain its integrity, surface adhesion and chip coverage despite the expansion and contraction of the packaging structure caused by power and temperature cycling. U.S. Pat. No. 6,091,603 issued Jul. 18, 2000 to Daves and Edwards and assigned to the present assignee, describes the use of a customized deformable lid understructure which permits a reduction in the amount of thermally conductive material in the primary heat dissipation path. FIG. 1, taken from the prior art '603 patent, shows a multichip module in which chip 600, mounted on chip-carrying substrate 500 by solder bumps 650, is thermally connected to deformable lid understructure 103, with which it lies in parallel using thermally conformable material 200. Deformable lid understructure 103 and chip 600 lack the microstructure of the present invention, employing instead deformable lid understructure 103 to reduce the thermally conductive paste thickness, resulting in improved heat dissipation.

Whenever a particle-filled paste is used between a flat cooling plate and a flat chip substrate, the thickness of the thermal paste layer is limited by the size of the largest particle present in the paste. Applying pressure to try to reduce the thickness of the paste layer risks cracking of the chip due to the concentration of pressure falling on the largest particles in the paste. However, it is desirable to have a range of particle size in the paste in order to improve the solid packing density. Separating the largest particles from the paste by sieving is theoretically possible, but impractical because as the particle size is further reduced, it becomes increasingly difficult and expensive to sieve out the particles which exceed the desired size range.

An additional difficulty observed with the use of thermal paste is the migration of the paste from behind the chip and the formation of voids due to differential thermal expansion of the various parts of the package during thermal cycling. Such paste migration can greatly increase the thermal resistance between the chip and the cooling plate during the lifetime of the electronic package, possibly causing catastrophic heating and destruction of the chip.

Several approaches in the art describe providing an altered surface of the cooling plate which is in contact with thermal paste. In U.S. Pat. No. 5,825,087 issued Oct. 20, 1998 to Invanti et al. and assigned to the present assignee, the cooling plate used in conjunction with a thermal paste or a thermal adhesive has been roughened by grit blasting or provided with a plurality of crisscrossing channels in order to improve the adhesion of the thermal medium and inhibit its flow during operation of the electronic module. FIG. 2, taken from the prior art '087 patent, shows in detail the channels 18 and corresponding protrusions 17 of roughened. area 16 of cooling plate 14 in which heat generated on chip 13 is removed by transfer through paste 15. The purpose of roughening the surface of plate 14 is to inhibit the movement of paste 15. U.S. Pat. No. 5,345,107, issued Sep. 6, 1994 to Daikoku et al. describes the use of a grooved solid body in conjunction with thermally conductive fluid or thermally conductive grease and a low-pressure spring to hold the solid body in close contact with the electronic device. In FIG. 3, taken from the prior art '107 patent, the excess capacity of grooves 40 and 41 on heat transfer surface 100 of solid thermal conductor 33 enables closer contact of the thermal conductive grease 11 (not shown in this figure) between heat transfer surface 100 and the heat transfer surface of the chip carrier 101 (not shown in this figure) when the pressure of a spring 34 (not shown in this figure) is applied. The presence of grooves is intended to prevent the thermally conductive medium from migrating to surfaces outside the device during power cycling and to allow the thickness of the thermally conductive medium to be reduced. In the structure described in the '107 patent, the minimum paste thickness is still limited by the largest particle size. In the present invention the average thickness of the paste applied between the nominally parallel cooling plate and chip is reduced below the size of the largest particle in the paste by creating discrete depressions into which the largest diameter paste particles are redistributed under pressure, facilitating cooling. At the same time, the presence of part of the largest particles above the discrete depressions inhibits lateral movement of smaller particles in the paste layer.

In FIG. 4, taken from prior art U.S. Pat. No. 5,298,791 issued Mar. 29, 1994 to Liberty and Jones, is described the use of a thermally conductive perforated, grooved or embossed sheet which is provided with pressure-sensitive adhesive film 11 on the major surfaces in order to bond one major surface to a heat source in a chip and to bond the other major surface to a heat sink (not shown in this figure) with which it is in contact. The function of the perforations, grooves or embossing is to remove air between the film and the flat surfaces with which it is in contact upon the application of pressure during the bonding process, a problem not seen in the present invention.

None of the prior art addresses the same problem in the same way to obtain the same result as in the present invention.

SUMMARY OF THE INVENTION

For the packaging of high performance integrated chips, it is necessary to further reduce the thermal resistance along the primary heat dissipation path from the chip, where the heat is generated, to the external surface of the module, where the heat is removed. This goal must be accomplished in a manner consistent with ongoing packaging requirements such as providing high speed and dense electrical interconnects, protection from the environment, low cost and high reliability. In high end servers which use multichip modules (MCMs), the cooling of chips mounted on the module is a key system constraint. About 70% of the thermal drop between the chip surface and the MCM heat sink is across thermally conductive paste when heat spreaders are not used. The thermal paste mediates the thermal expansion mismatch between the chip, which typically comprises silicon, and the thermal hat or cap, which is typically made of copper or aluminum. If a heat spreader is used, the fraction of the thermal drop across the paste layer is reduced, but many system designs do not have enough room on the MCM to permit the use of heat spreaders, and heat spreaders are an added cost. For single chip modules (SCMs) which mount a single high power chip, a heat spreader, also known as a thermal spreader, having a thermal coefficient of expansion close to that of the chip is attached to the back of the chip using a material such as a silver filled epoxy or solder which is noncompliant and nonconformable after curing or solidification. A layer of thermal paste, or other thermally conductive conformable material, is then used between the thermal spreader and the thermal hat, also known as a thermal cap or heat sink. With each succeeding CMOS generation the power density (W/cm$^2$) of the processor chips has increased, and that trend is likely to continue apace as chip circuit density and clock frequencies are further increased. The traditional means of reducing the thickness of the thermal paste or attaching heat spreaders directly to the processor chips are not adequate for projected future servers. The ability to reduce the thickness of the thermal paste is limited by the size of the largest of the particles present in the paste. Attempting to reduce the thickness of the paste to a thickness below that of the largest particles by increasing the applied force results in a concentration of stress which can crack the chip.

In the present invention a discretely shaped microstructure is provided on at least one of the surfaces in contact with a compliant, or flexible, thermally conductive conformable material, such as a thermal paste. When pressure is applied, the largest particles within the paste, facilitated by the slope of the walls within the microstructure, are preferentially directed toward the floors in the microstructure.

The result of the migration of the largest particles into the microstructure is that the average thickness of the paste is reduced, and hence the thermal resistance of the paste layer and temperature drop across the paste layer are reduced. The thermal conductivity across the paste thickness can be represented as a parallel resistor network. Therefore a microstructure in a corrugated or rectangular pattern in which the average thickness of the paste is the same as that of a planar structure would have a lower thermal resistance, especially if the paste is very thin directly above the projecting flat surfaces between cells. The thickness of the paste could be further reduced in combination with reducing the size of the largest particles within the thermal paste as manufactured.

The present invention does not require the fabrication of additional parts within the IC chip or on the module. Process and structure changes pursuant to creating the discrete microstructure are minimal. In an embodiment of the invention the microstructure pattern is readily formed on the back surface of a silicon chip by anisotropic wet etching. In a further embodiment in which a thermal spreader is used, the microstructure pattern is formed on the surface of the thermal spreader in contact with the thermal paste layer by using a master as a mold during the formation of the thermal spreader. Alternatively, the microstructure can be formed on the heat sink side of the thermal paste layer by a process such as electroforming from an etched silicon, or other, master.

BRIEF DESCRIPTION OF THE DRAWINGS

FIG. 9 is a schematic top view illustrating the structure shown in FIG. 8 as comprising an elongated rectangular shape.

FIG. 10 is a schematic top view illustrating the structures shown in FIG. 8 as comprising a square shape.

FIGS. 13–16 are schematic top views of examples of possible microstructure patterns etched on the back side of an integrated circuit chip.

DESCRIPTION OF THE PREFERRED AND VARIOUS EMBODIMENTS

The present invention is directed to a chip structure and module in which thermally conductive paste is used for heat transfer between the chip and the cooling plate between which the paste is confined in a nominally parallel configuration. When pressure is applied, an arrangement of discretely shaped depressions and grooves receives the largest size particles of the paste, effectively reducing the average thickness of the paste and increasing cooling efficiency.

Figure 1:
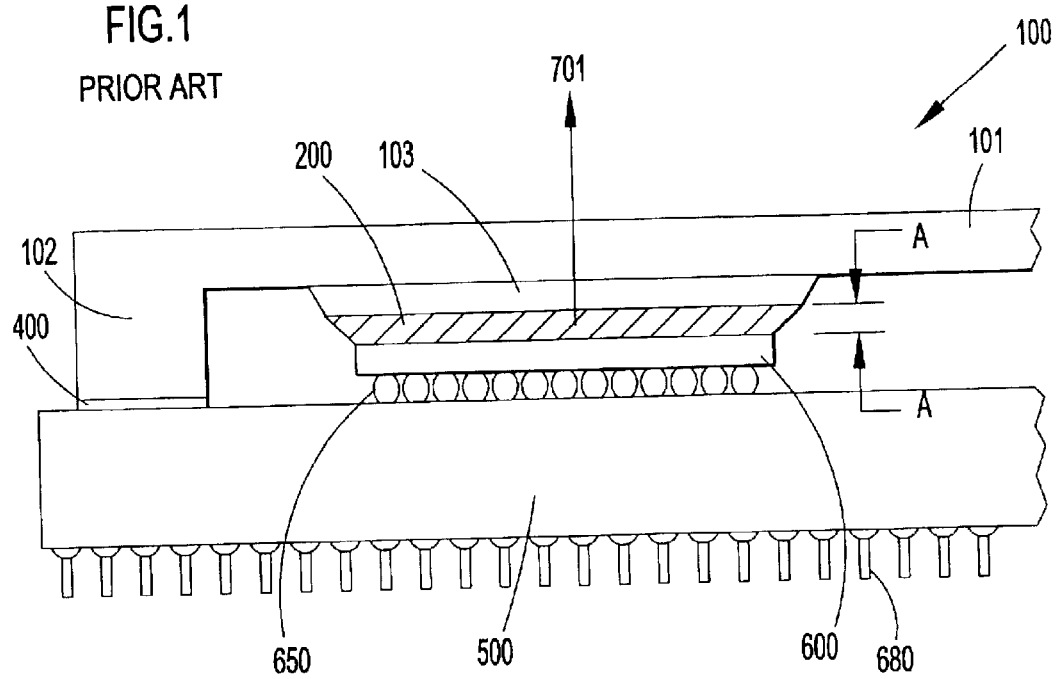
FIG. 1 is prior art, shown as FIG. 1 in U.S. Pat. No. 6,091,603.
Figure 2:
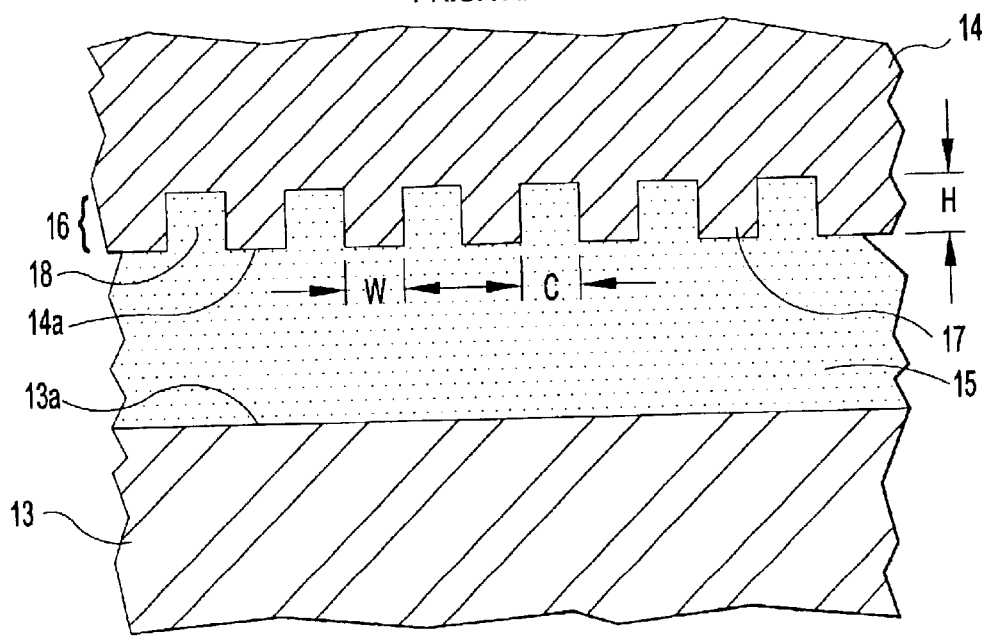
FIG. 2 is prior art, shown as FIG. 2 in U.S. Pat. No. 5,825,087.
Figure 3:
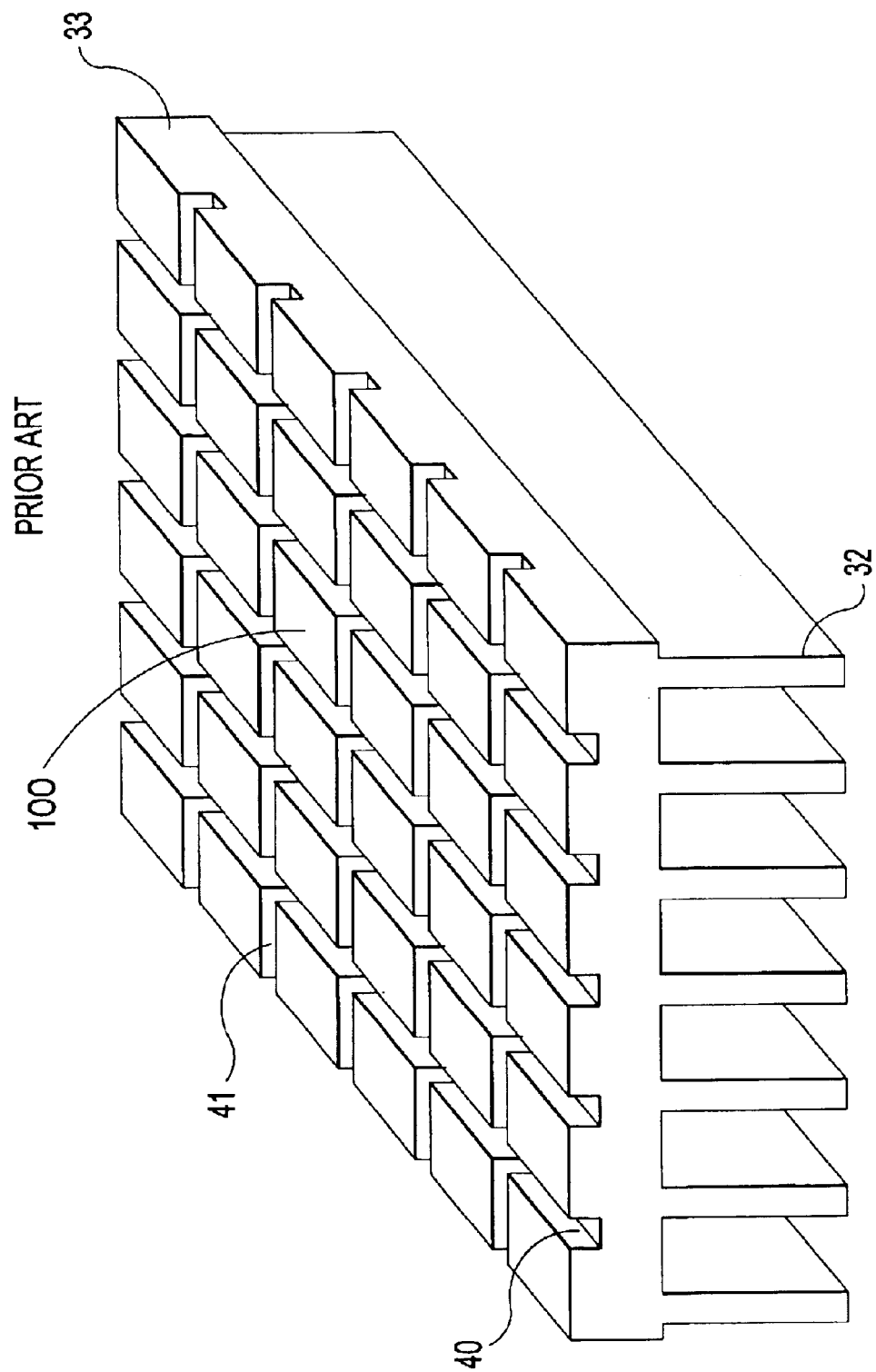
FIG. 3 is prior art, shown as FIG. 15 in U.S. Pat. No. 5,345,107.
Figure 4:
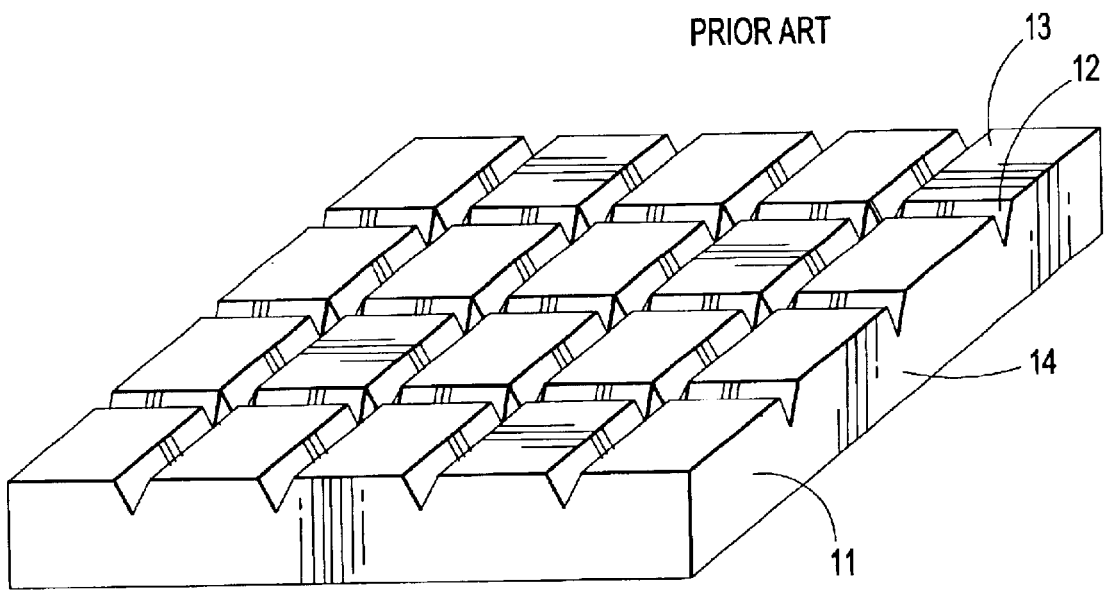
FIG. 4 is prior art, shown as FIG. 2 in U.S. Pat. No. 5,298,791.
Figure 5:
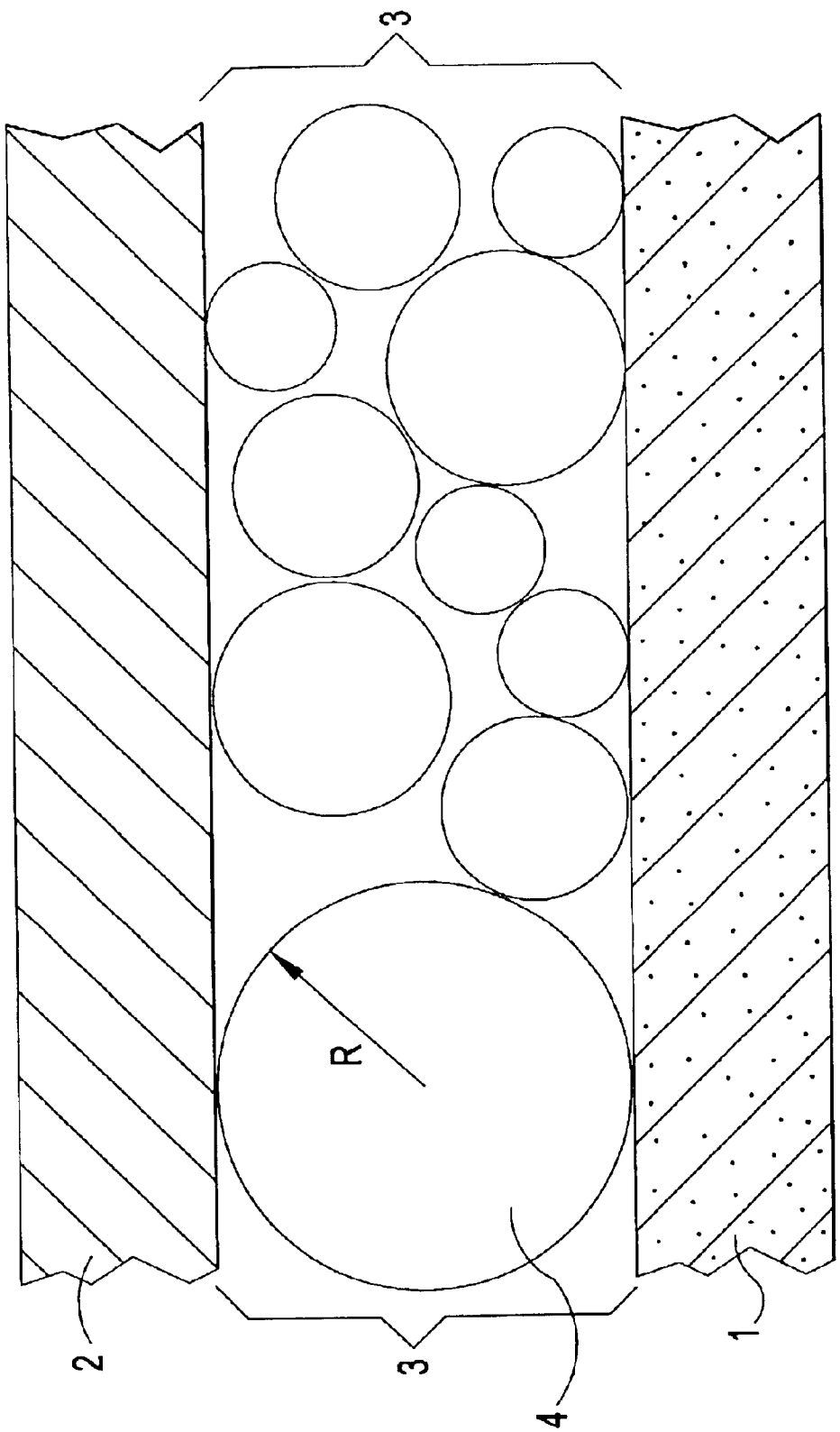
FIG. 5 is a schematic cross sectional side view illustrating how a largest radius particle limits the reduction of the thickness of thermally conductive paste in prior art flat plate cooling.
Figure 6:
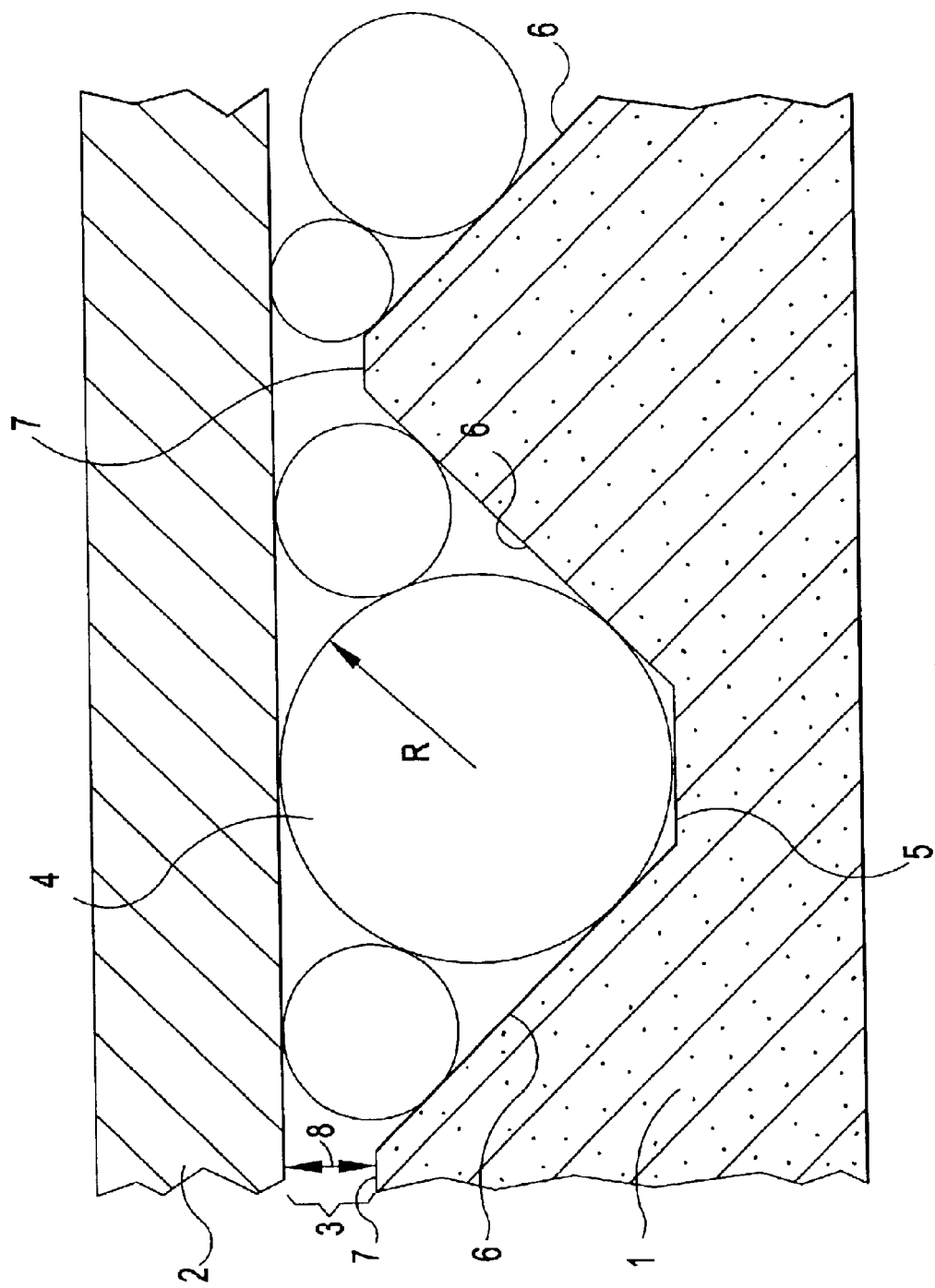
FIG. 6 is a schematic cross sectional side view illustrating a largest radius particle within a recess on a surface having microstructure.

Prior art FIG. 5 shows flat chip (1) in thermal contact with and nominally parallel to flat cooling plate (2) through thermally conductive paste (3), which is comprised of particles of varying sizes including the particle (4) having the largest radius R. The principal thermal path is from chip (1) through paste (3) to the outside through cooling plate (2). The average thickness of the thermally conductive paste in the present invention is not limited, as it is as shown in FIG. 5, to the largest size particle of which the paste is comprised. Thermally conductive paste is typically comprised of a distribution of particles of varying sizes and shapes with a high volume percentage of solids, such as between about 55% and about 80% by volume, as described in the '609 patent. In the present invention the average thickness of the paste is reduced by providing a discretely shaped microstructure pattern on at least one of the surfaces which will be in direct contact with the paste. The pattern may be formed on the heat sink side, the chip side, or both. FIG. 6 shows a recess having a flat bottom surface (5) and sloped surfaces (6) which have been provided as part of a pattern of such recesses in silicon substrate (1) by wet etching through a mask using TMAH (tetramethyl ammonium hydroxide) and water. Another suitable semiconductor substrate material/etchant combination could be used to create a recess pattern as long as that combination can also provide a recess in which the depth is sufficient to contain the largest radius particle and the slope or other recess shape is sufficient to facilitate the entry of the largest radius particle.

The above concept is illustrated for one case as an array of grooves. Each repeating recessed unit of microstructure is referred to as a cell, with the cross section shown in FIG. 6. The desired cell geometry depends on the largest particle size and shape. Although only spherical particles are used to illustrate the concept in the present invention, it should be understood that the actual particle shapes will vary and that the preferred microstructure should be adjusted accordingly. As will be described, the slope angle is fixed at 54.74 degrees since anisotropic silicon etching was used to form the microstructure. In the FIG. 6 embodiment, each cell floor, identified as recessed flat surface (5), has a width of approximately 10 microns. At the perimeter of the cell, there remains a projecting flat surface (7) of less than approximately 5 microns between the entrance to an adjoining cell. The groove-shaped cell is 58.5 microns wide, and would be 41.4 microns deep if fully etched, which would be large enough so that particle (4) positioned therein would project 10 microns above the projecting flat surfaces (7) between cells. Therefore, gap (8) between projecting flat surface (7) and cooling plate (2) would be 10 microns. Since the particle will rest on the sloped walls of the cell, going deeper than 27.5 microns will not lower the particle further. The width of the flat bottom of the cell would be 16.1 microns. With a 5 micron width on the projecting flat surface (7) and 10 microns of paste above it, the average thickness of the paste would be 27.6 microns, which would correspond to an effective paste thickness, using a simple approximation as parallel resistor, of 22.6 microns, a 40% reduction in thermal conductivity compared to a uniform, flat paste layer 37.5 microns thick.

Figure 12:
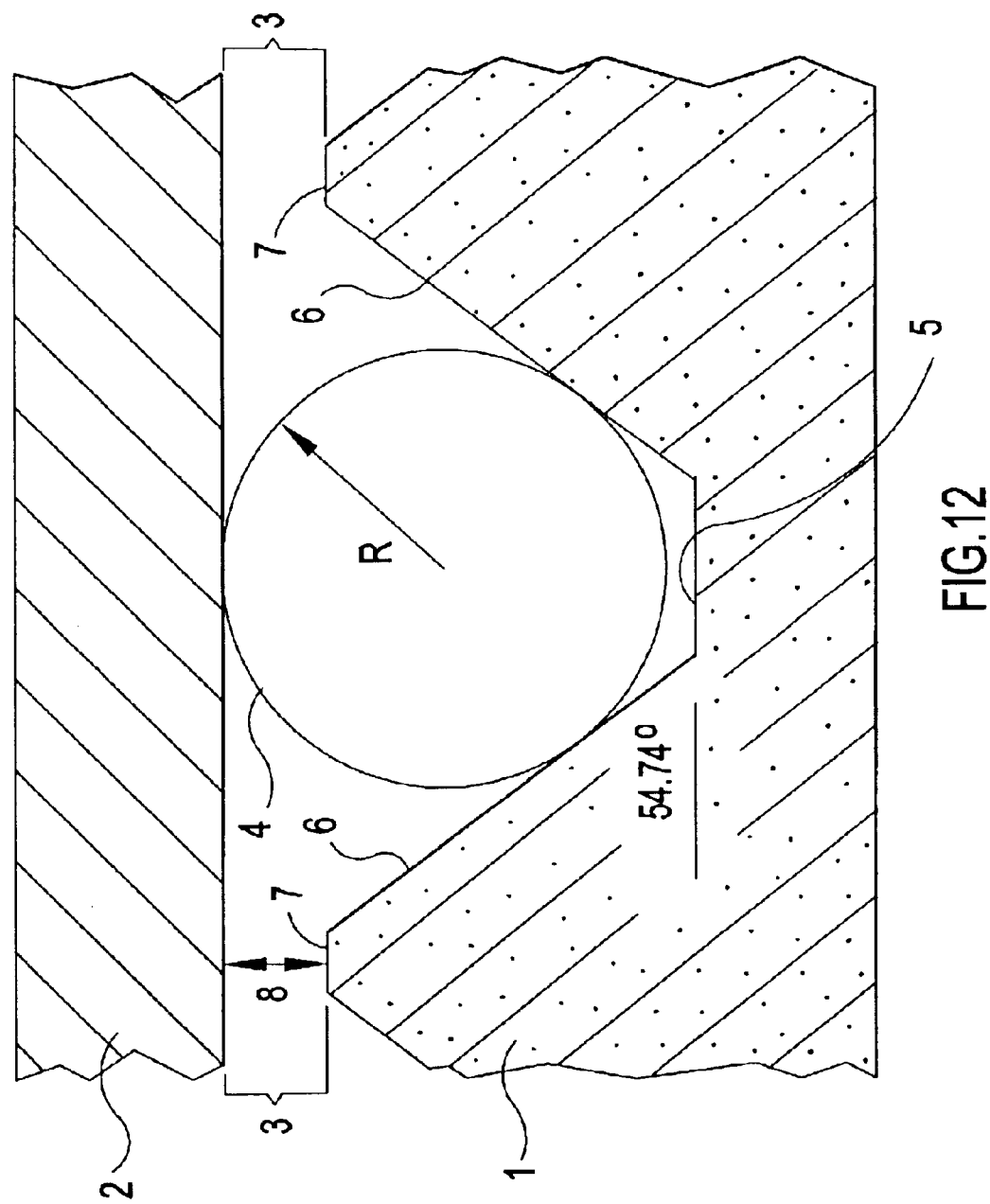
FIG. 12 is a schematic cross sectional side view of a largest-radius particle positioned in an anisotropically etched groove recess in a silicon chip.
Figure 13:
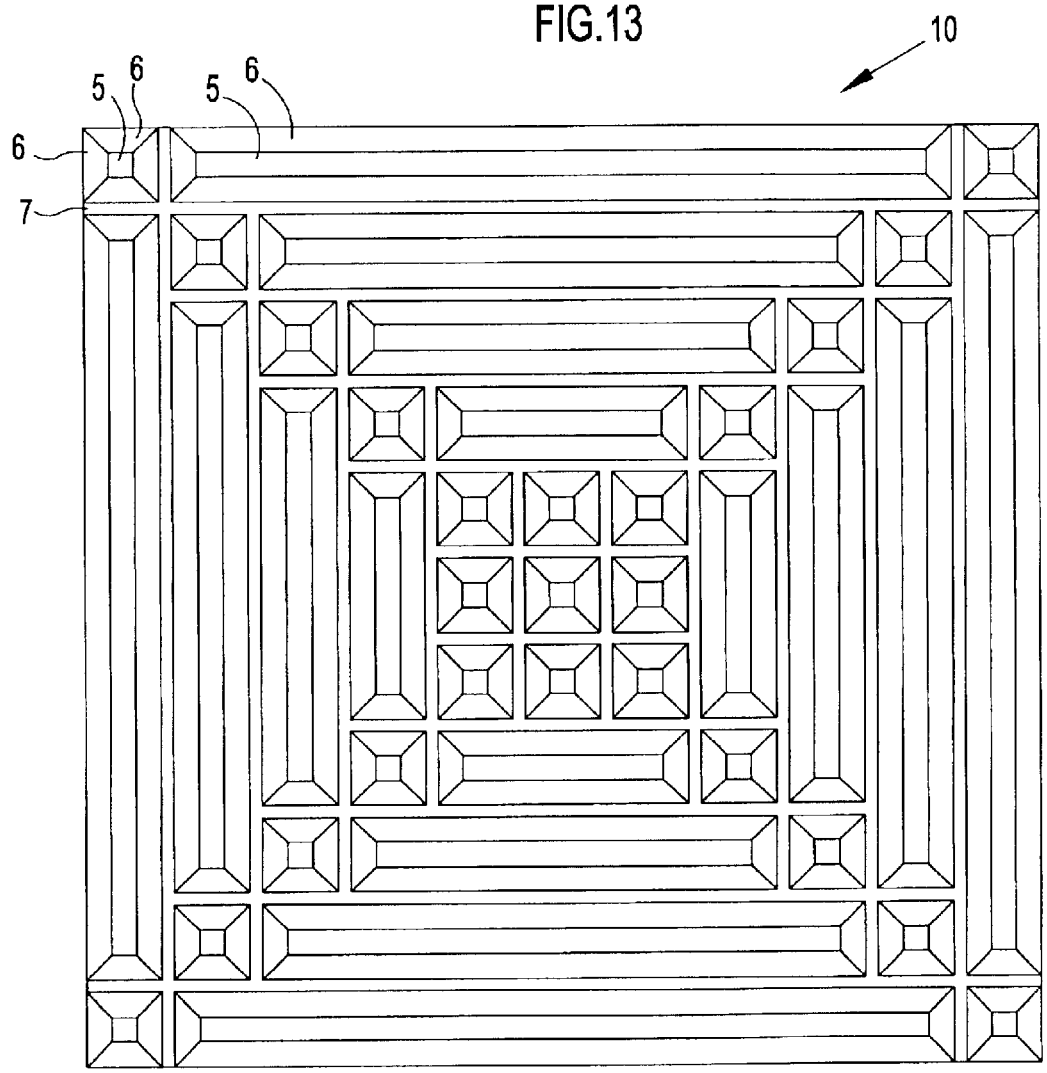
Figure 14:
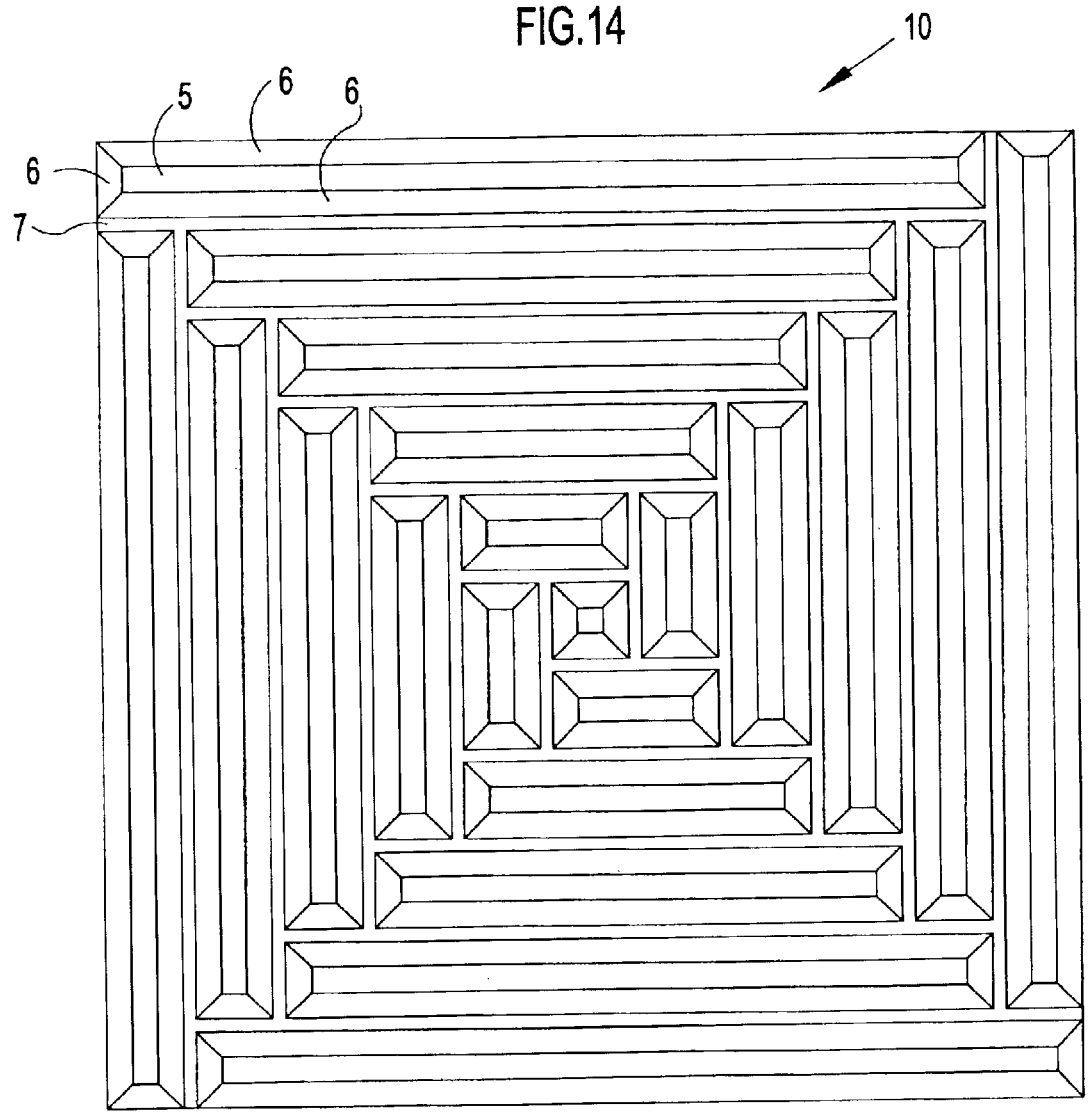
Figure 15:
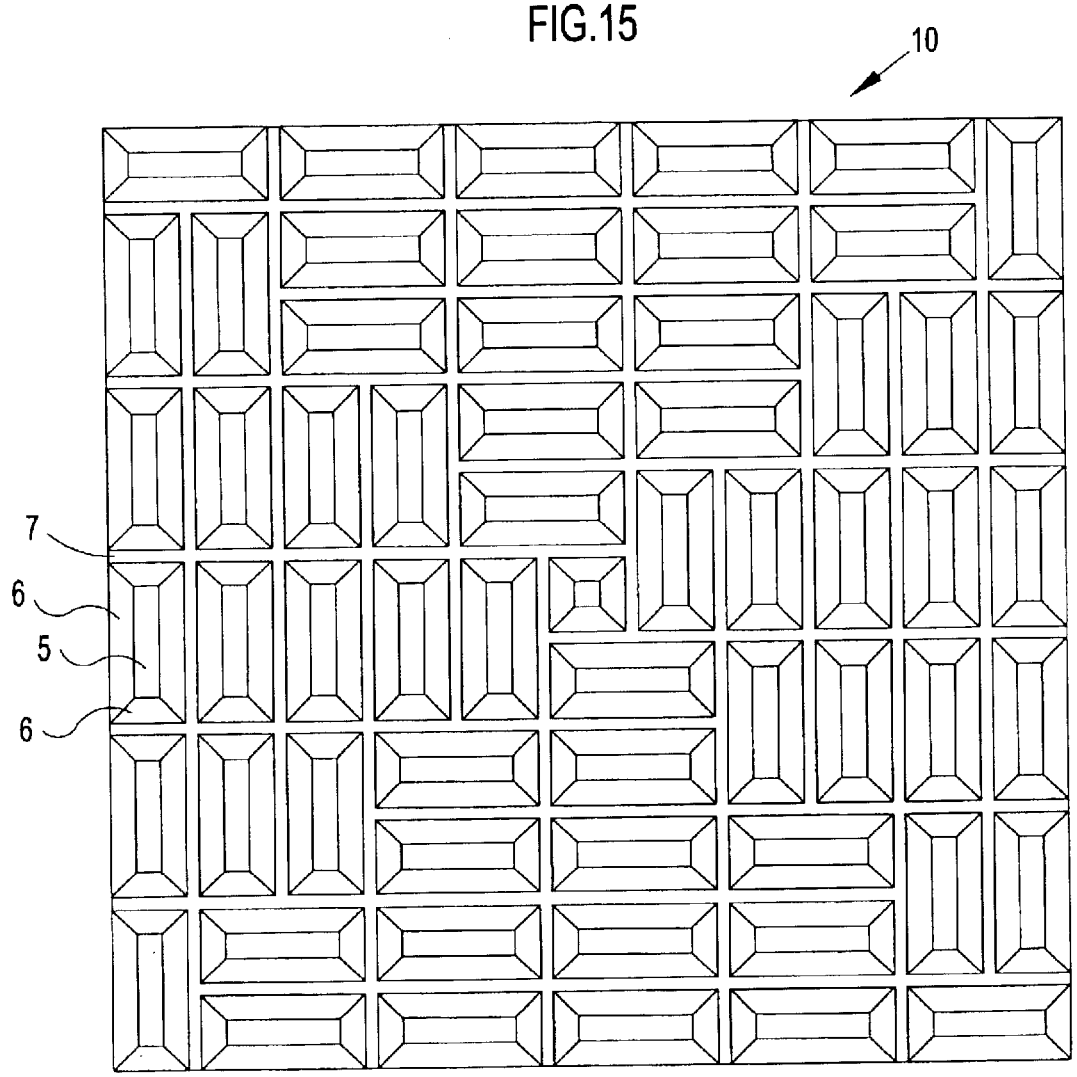

If the microstructure is formed by anisotropic etching of the back surface of the chip, the angles available for sloped surfaces may be limited. Most silicon-based integrated circuits use (100) oriented single crystal silicon, in which case the angle of the sloped surface is 54.74 degrees, as indicated in FIG. 12. FIGS. 13–16 provide non-limiting examples of etched recessed patterns as they would appear from the top of the backside of the chip, ready for contact with thermally conductive paste. For reduced cost and ease of integration, it may be desirable to form the discrete microstructure shown in FIGS. 9–10 and 13–16 on the cooling plate surface which will be in direct contact with the thermally conductive paste rather than on the IC. Microstructures such as those described in FIGS. 8–10 and 13–16 can be fabricated readily by diamond ruling and electroforming. In diamond ruling engines, which are used to form precision blazed grating, a diamond is used to deform a metal surface in a series of lines or grooves, the shape and tilt of the diamond determining the resulting groove shape. The shapes shown in FIGS. 8–10 and 13–16 are the reverse image of what would be formed by diamond ruling and could be formed from a master, or from an even generation replica of a master, by electroforming. The electroformed microstructure could then be bonded to a flat cooling plate in the region where the thermal paste would be contacted.

Figure 7:
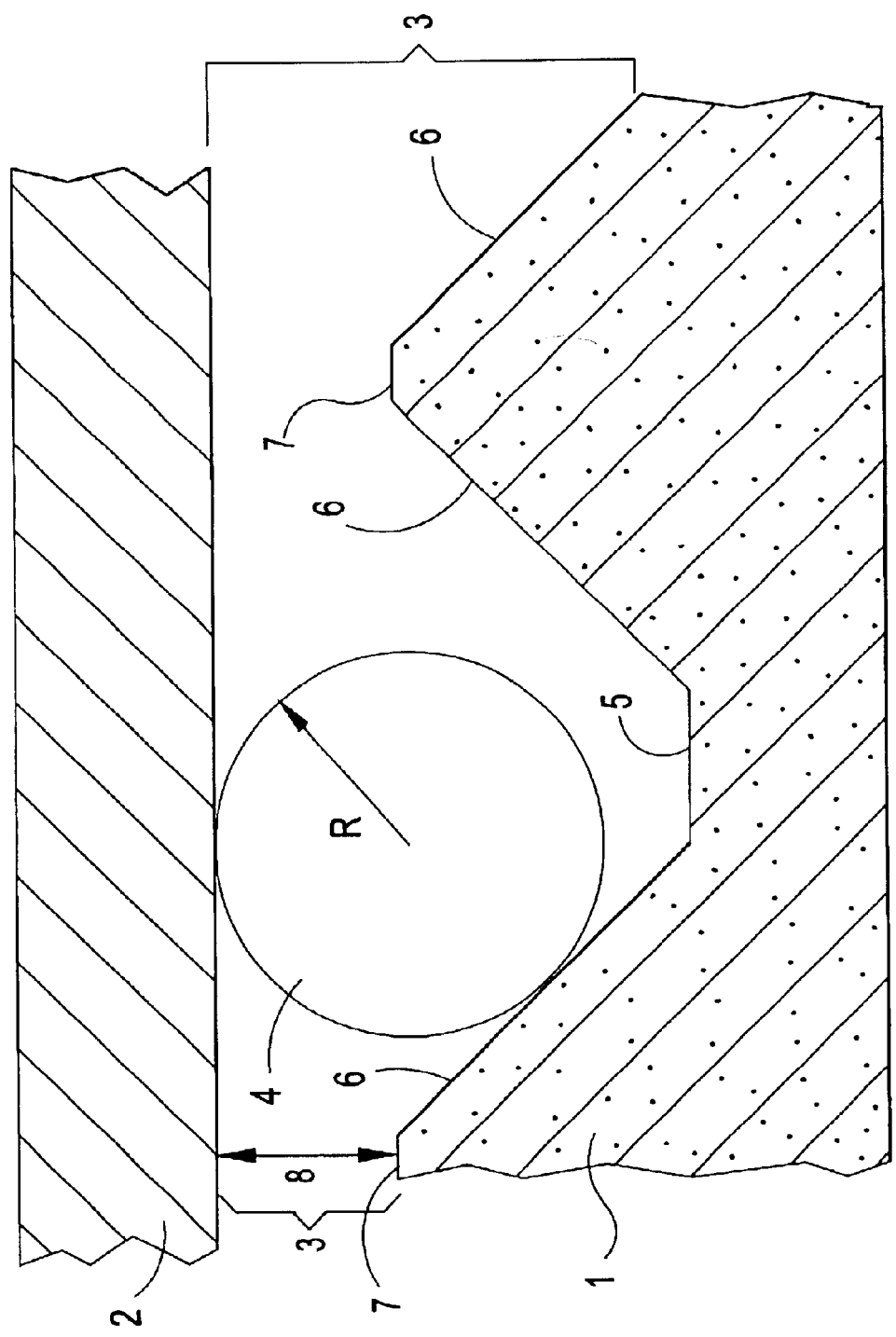
FIG. 7 is a schematic cross sectional side view illustrating how the application of pressure to the thermally conductive paste layer reduces thickness by moving a largest radius particle into a recess within a surface having microstructure.

Subsequent to the formation of the discrete pattern of recesses, nominally vertical downward pressure is applied to particle (4) as shown in FIG. 7, causing it to be sorted out from smaller particles and to be moved down slope (6) toward recessed flat surface (5), thereby reducing the thickness of the paste. Whether the largest particles move downward depends on the balance of forces. The force directing downward and laterally depends on the applied force, the value of slope (6) and the coefficient of friction between the paste particles and the material at the surface of the slope (6). The downward motion is opposed by the viscosity of the thermal paste and friction among particles in the paste. The viscosity of the paste can be reduced by heating or by diluting with added binder, and periodic vibration or agitation can be applied to facilitate movement downward of the largest particles as the pressure is applied. The result is a thinning of the thermal paste layer and a reduction in thermal resistance.

Figure 8:
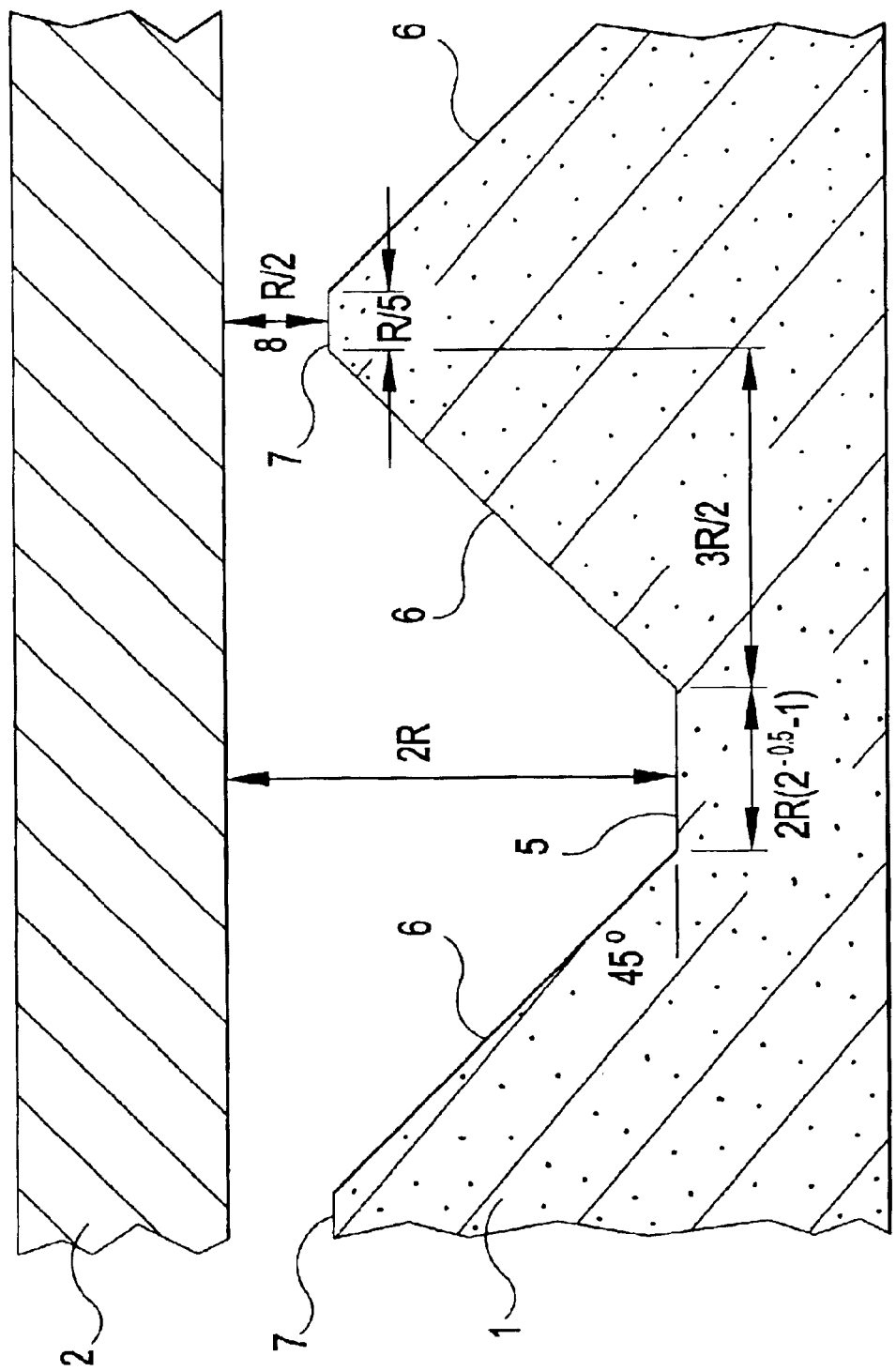
FIG. 8 is a schematic cross sectional side view illustrating the structure shown in FIG. 6, without the paste layer, in which a set of relative dimensions is identified.

FIG. 8 indicates one possible set of relative dimensions for slope (6) as 45 degrees, distance between recessed flat bottom surface (5) and the bottom of cooling plate (2), which is also the diameter of maximum particle size, as 2R, width of recessed flat bottom surface (5) as $2R(2^{-0.5}-1)$ such that a spherical particle contacting the sloped sides (6) would also contact the recessed flat bottom surface (5); gap (8) between projecting flat surface (7) and cooling plate (2) as R/2; width of projecting flat surface (7), which is also the distance between the openings of adjacent slopes (6), as R/5. The width of projecting flat surface (7) is chosen as a value which is small enough so that the largest particles are not stable resting on (7) in gap (8). In the top view FIG. 9 is clearly shown the dimension of 3R/2 for the distance between recessed surface (5) and projecting flat surface (7) when microstructure (10) is an array of grooves; in FIG. 10 when it is an array of squares.

The reduction in the thermal resistance of the thermal paste can be understood from FIGS. 8–10. In FIG. 10 a schematic top view of a microstrucured surface (10), which is shown in schematic cross section in FIG. 8, in which the individual elements (5), (6) and (7) of the discretely shaped recessed microstructure (10) are defined, is shown for an array of squares. In FIG. 9, microstrucured surface (10) is shown for an array of grooves. Grooves and squares are seen together in microstructure (10) patterns shown in FIGS. 13–16. The average thermal paste thickness in FIGS. 8 and 9 is 1.36R, compared to 2R for the prior art shown in FIG. 5. The average thermal paste thickness in FIG. 10 is 1.06R— only 53% of the prior art paste thickness shown in prior art FIG. 5. In fact the performance is even more advantageous, because using the average paste thickness results in an overestimate of the thermal resistance compared to calculating the effective paste thickness by solving the parallel resistor problem, where the thermal resistance at each location is proportional to the inverse of the. paste thickness.

Figure 17A:
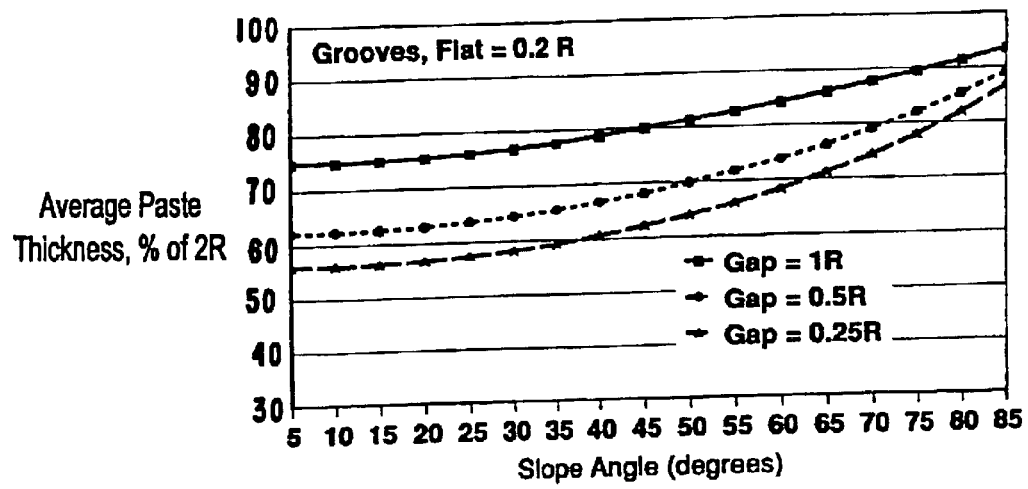
FIGS. 17A–D and 19A–D are the graphic plots of simulation results from varying the elements described above in FIG. 18 on the calculated average and effective thermal paste thicknesses.
Figure 17B:
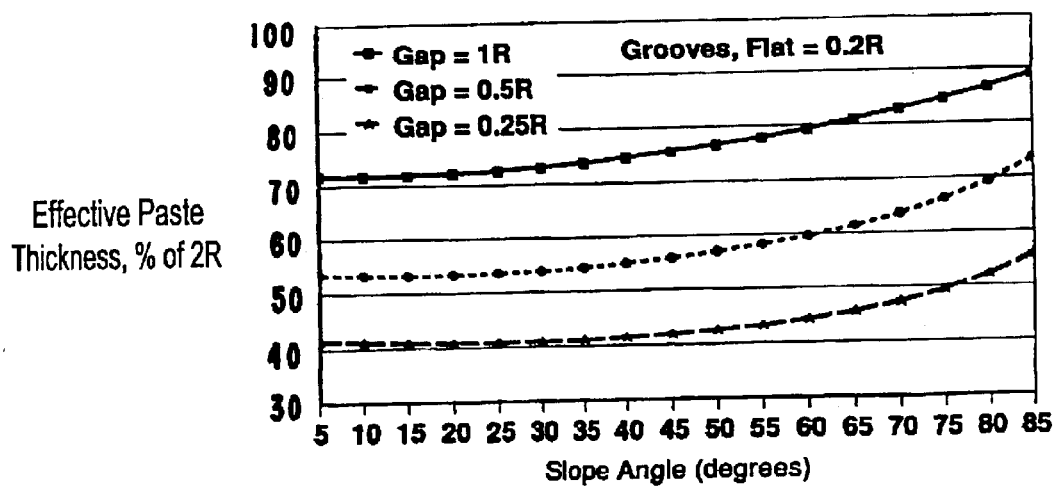
Figure 17C:
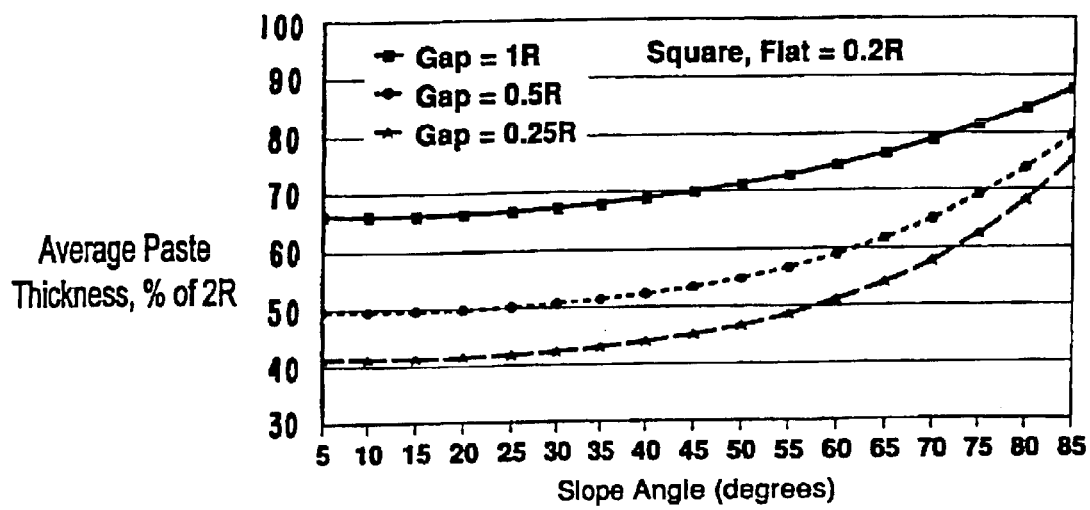
Figure 17D:
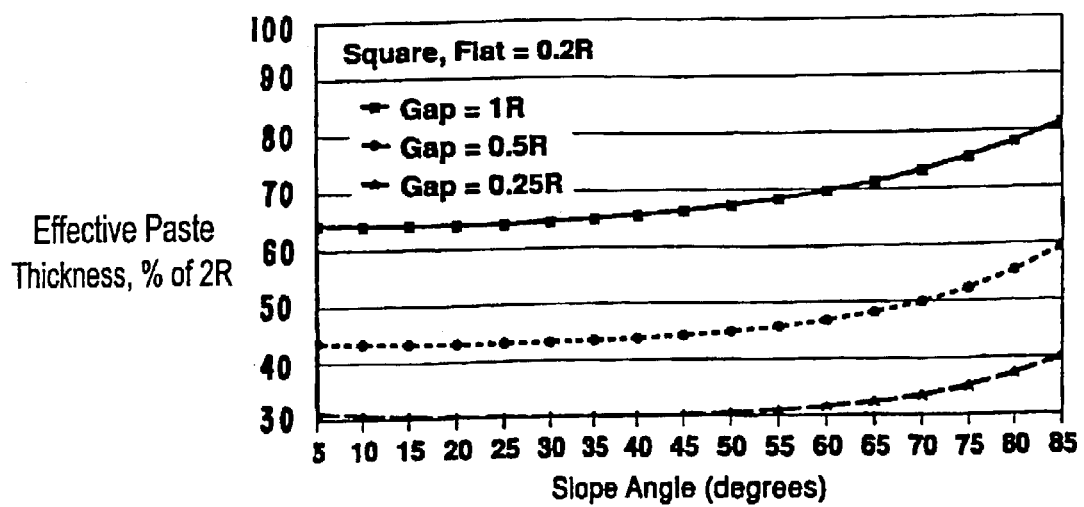
Figure 18:
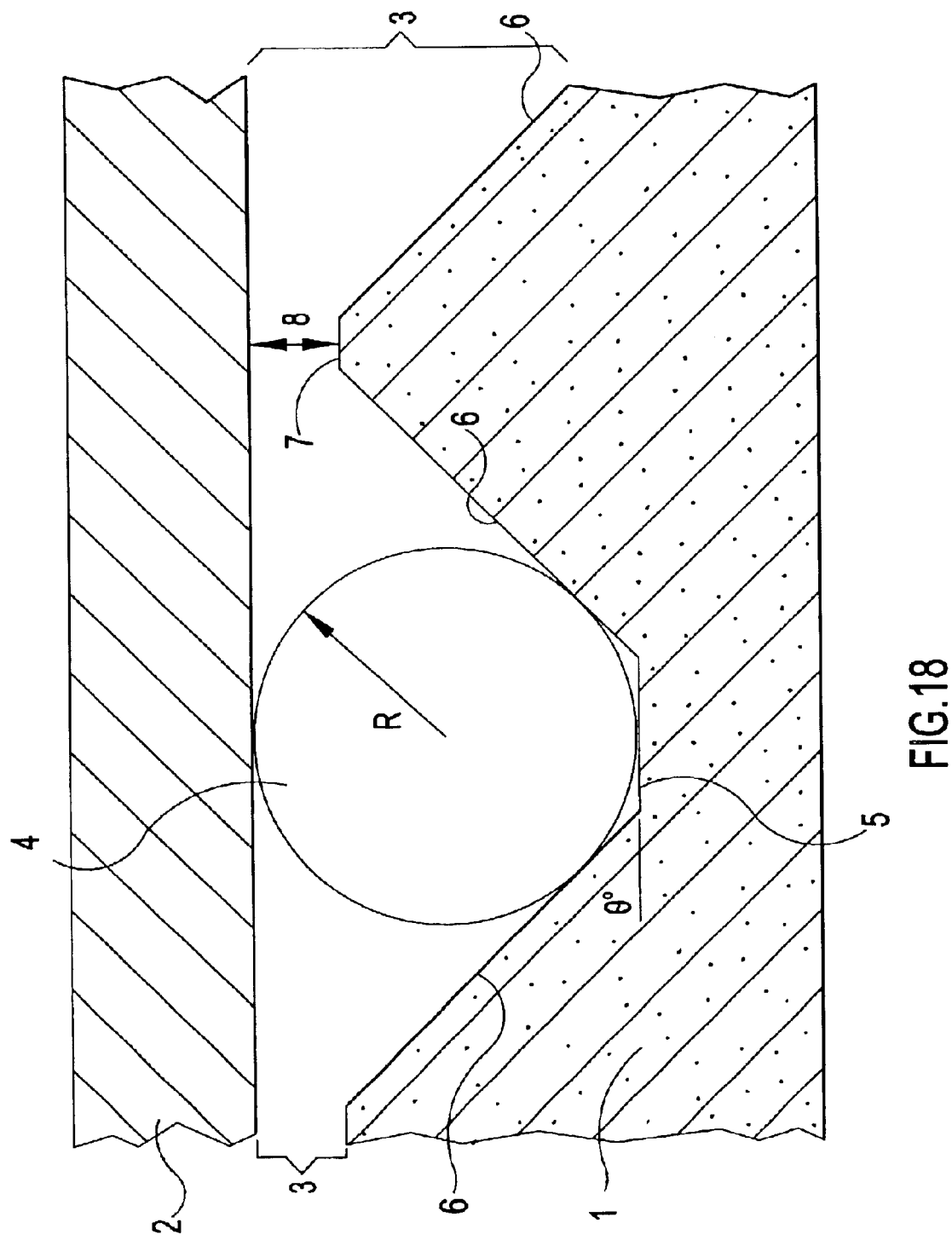
FIG. 18 is a schematic cross sectional side view of a largest-radius particle within a recess emphasizing, with FIGS. 9 and 10, the elements contributing to the calculations of thermal paste thickness.
Figure 19A:
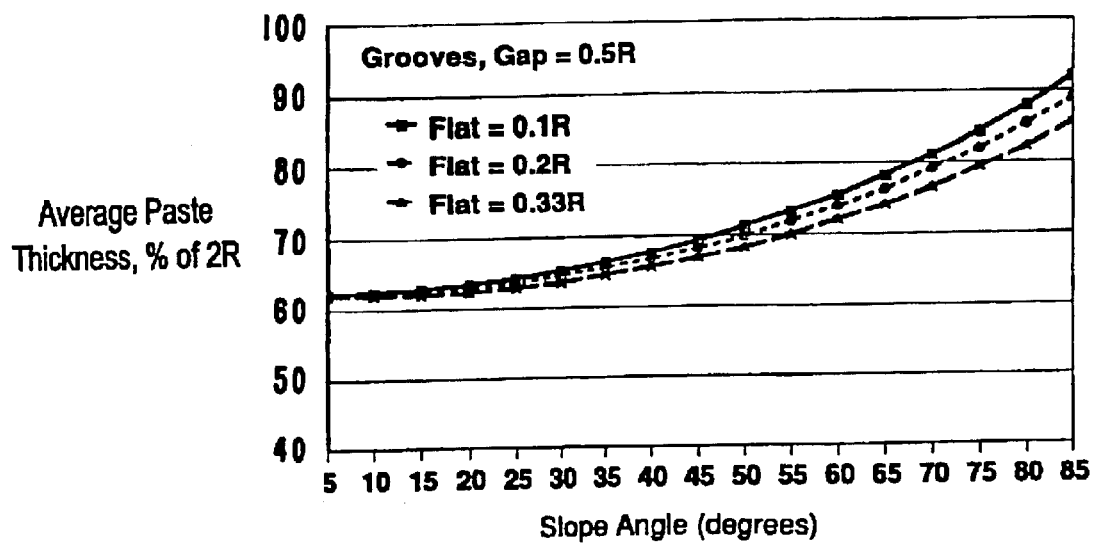
Figure 19B:
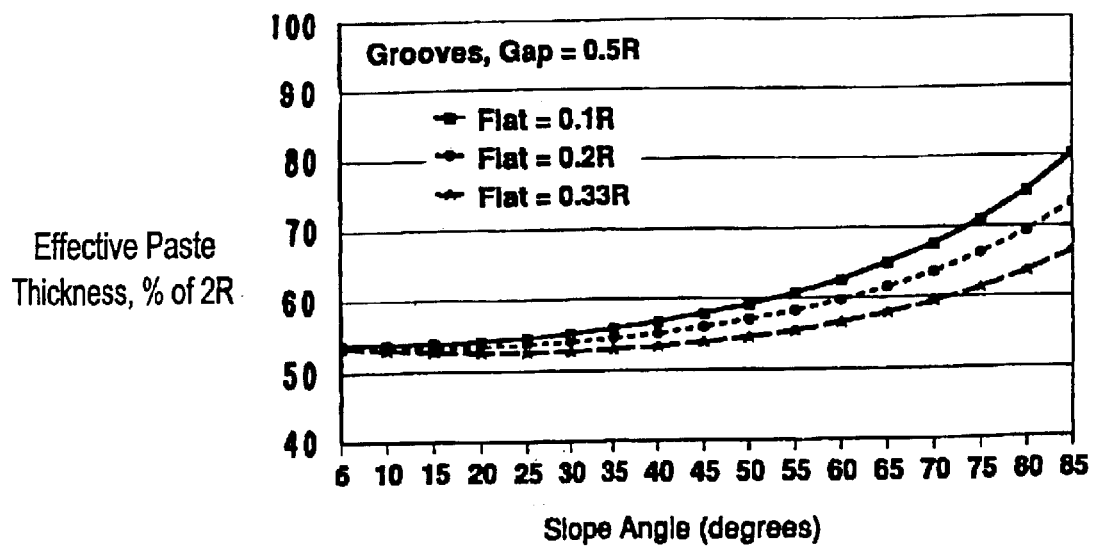
Figure 19C:
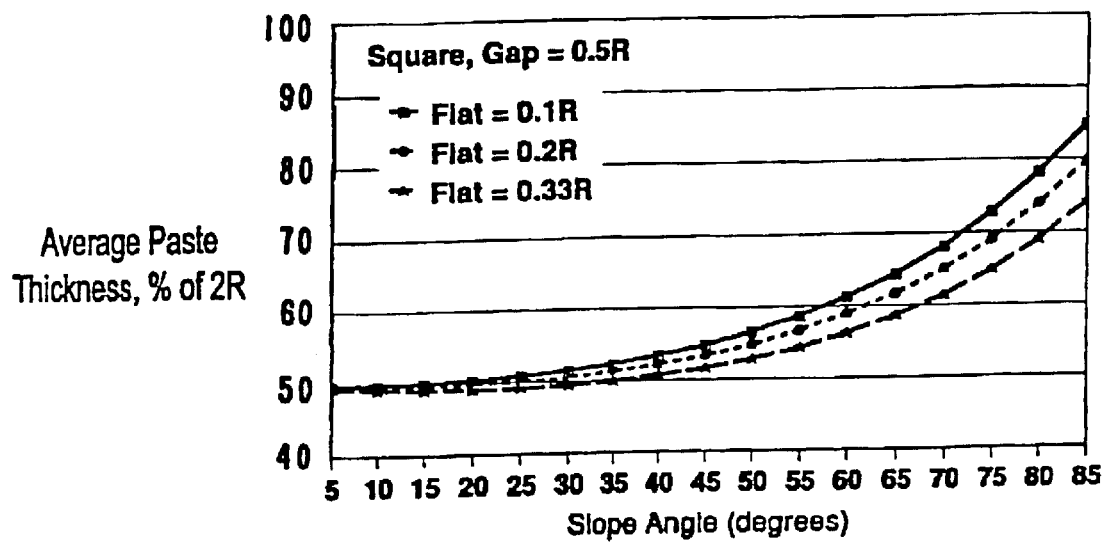
Figure 19D:
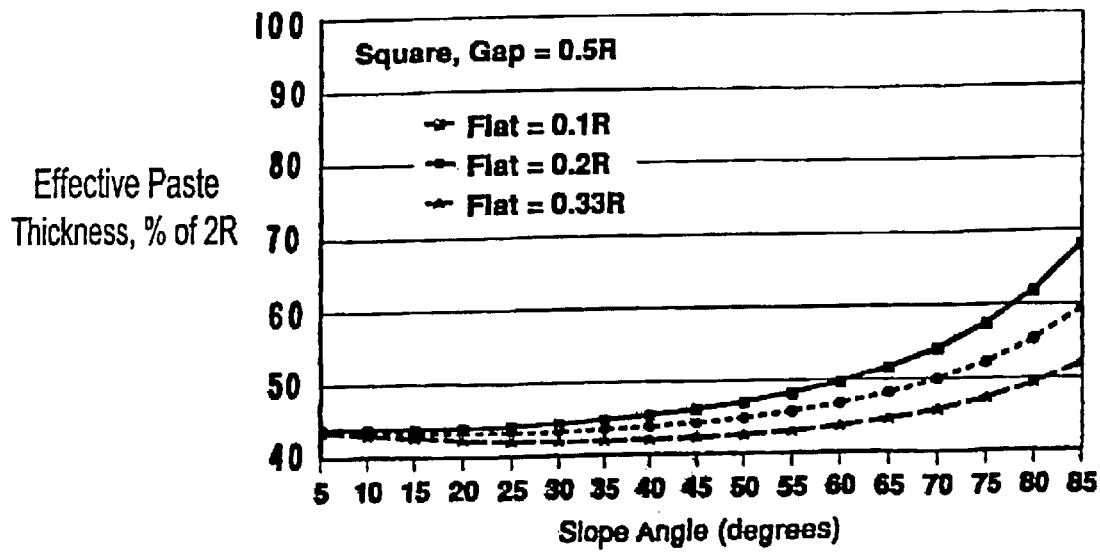

Using the cross section shown in FIG. 18, the average thermal paste thickness and the effective thermal paste thickness versus the largest particle size have been numerically calculated for one-dimensional flat bottom linear pattern microstructures shown as (10) in FIG. 9, and for two-dimensional flat bottom square pattern microstructures shown as (10) in FIG. 10, where the slope angle (θ) and the gap (8) were varied for a width for projecting flat surface (7) of 0.2R, shown in FIGS. 17A–D, and where the slope angle (θ) and the width for projecting flat surface (7) were varied for a gap (8) of 0.5R, shown in FIGS. 19A–D. Specifically, FIGS. 17A and 17B show the paste layer thickness versus the largest particle size for the flat bottom linear, i.e. groove, pattern shown as (10) on FIG. 9, FIG. 17 A showing average paste thickness and FIG. 17 B showing effective paste thickness, for values of gap (8) of 1R, 0.5R and 0.25R, the slope angle (θ) varying. FIGS. 17C and 17D show the paste layer thickness versus the largest particle size for the flat bottom square pattern shown as (10) on FIG. 10, FIG. 17C showing average paste thickness and FIG. 17D showing effective paste thickness, for values of gap (8) of 1R, 0.5R and 0.25R, the slope angle (θ) varying. Similarly, FIGS. 19A and 19B show the paste layer thickness versus the largest particle size for the flat bottom linear, i.e. groove, pattern shown as (10) on FIG. 9, FIG. 19A showing average paste thickness and FIG. 19B showing effective paste thickness, for values of projecting flat surface (7) of 0.1R, 0.2R and 0.33R. the slope angle (θ) varying. FIGS. 19C and 19D show the paste layer thickness versus the largest particle size for the flat bottom square pattern shown as (10) on FIG. 10, FIG. 19C showing average paste thickness and FIG. 19D showing effective paste thickness for values of projecting flat surface (7) of 0.1R, 0.2R and 0.33R, the slope angle (θ) varying.

From the results in FIGS. 17A–D and FIGS. 19A–D, the value of gap (8) is the most important variable and it should be minimized. Slope angles (θ) of between 5 and 60 degrees give about the same results, with shallow angles (θ) being slightly better. Therefore, the approximately-55 degree angle (θ) of anisotropically etched silicon referred to above should perform well and is not a limitation on forming the optimum microstructure. The two-dimensional flat bottom square microstructure results in a slightly thinner average and slightly thinner effective paste layer than comparable one-dimensional microstructure. Variations of the width of projecting flat surface (7) of between 0.1R and 0.33R only slightly changed the values for the average and the effective paste thicknesses for slope angles (θ) less than or equal to 60 degrees.

Figure 11:
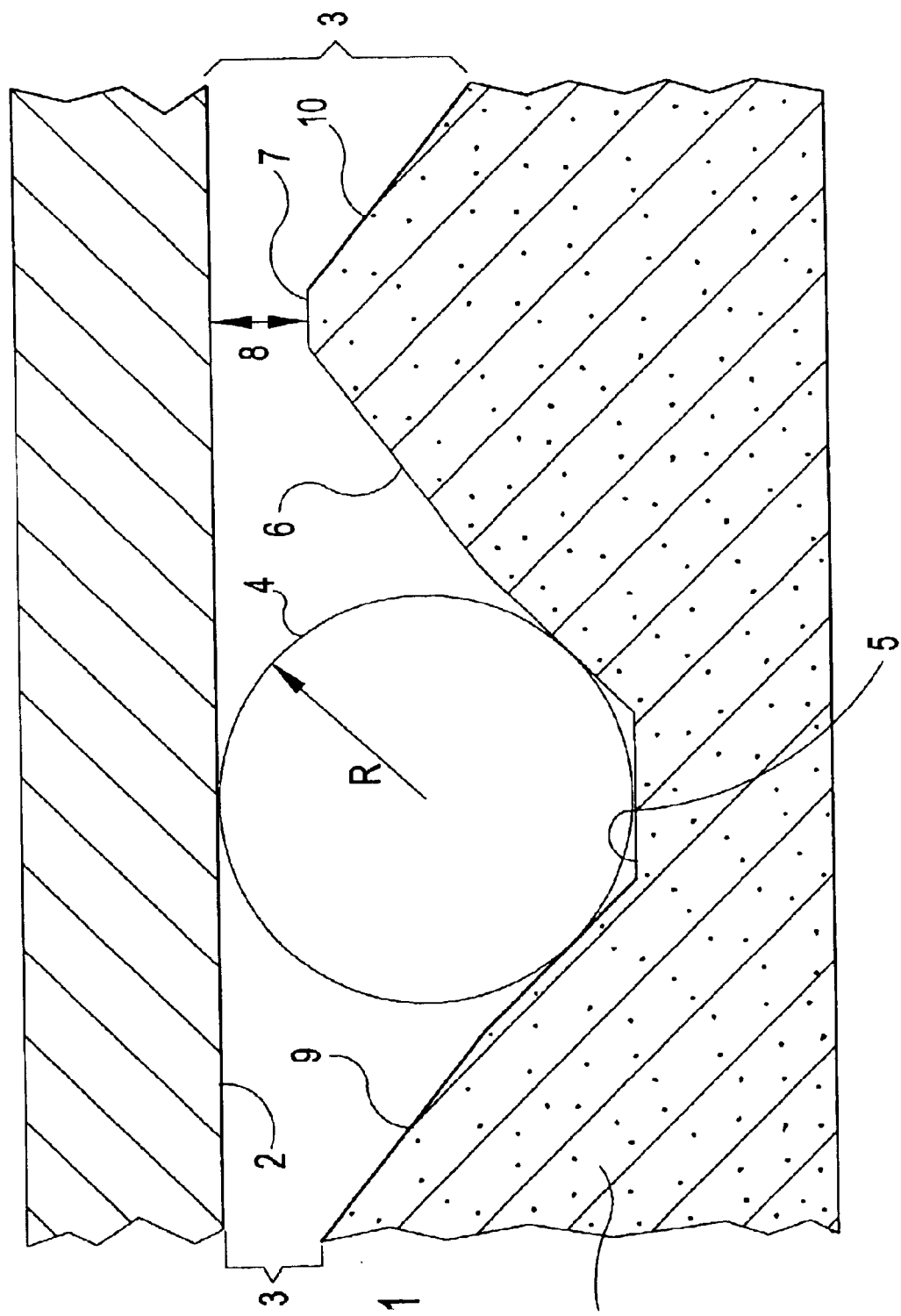
FIG. 11 is a schematic cross sectional side view of a largest-radius particle within a recess on a surface having microstructure illustrating an alternative in which the sloped surface comprises two regions with differing slopes.

If the microstructure master is formed using diamond ruling, or by means other than silicon anisotropic etching, the microstructure can be formed where the sloped surface is comprised of two regions with differing slopes. FIG. 11 provides an example of cells in which the top region of the sloped surface (6) has a shallower slope than the region adjacent to the recessed flat bottom surface (5). Alternatively a slope could be formed having a curved or faceted profile, a combination of curved and flat segments or a mixture of shapes. For example, it may be desirable in a particular situation to increase the slope angle, i.e. make steeper, the sloped surface close to recessed flat bottom surface (5) compared to near the projecting flat surface (7) so that a greater lateral force is generated as the particle approaches the recessed flat surface and the viscous counter force increases. Such a design may be needed for the best particle sorting, since multiple particles could come in contact with each other as the recessed flat surface is approached.

The presence of the microstructure minimizes migration of thermal paste from behind the chip during thermal cycling. Narrow gaps (8) from the chip to the cooling plate which are between recesses block the migration of the relatively larger particles. Furthermore, the accumulation of larger particles (4) within the recesses further block paste migration. A preferred embodiment makes use of recesses which are longer in one dimension than in the other, such as elongated rectangles, and orients the longer dimension parallel to nearby chip edges, as shown in FIGS. 13–16. This orientation increases the barrier to the migration of paste from behind the chip to the chip edge.

In a preferred embodiment of the discretely shaped microstructure, about 60% or more of the surface area of the chip or cooling plate or thermal spreader in contact with the thermally conductive conformable material is comprised of recessed or sloped surfaces, the average slope angle of the sloped surfaces being about 80 degrees or less. More preferably the average slope angle of the sloped surfaces should be between about 30 degrees and about 70 degrees. The microstructure should be comprised of an array of unit cells which cover the two-dimensional surface in which the minimum width between adjacent projecting flat surfaces (7) is about 0.5 mm or less, or more preferably between about 5 and about 200 microns. The recessed flat surfaces need not be perfectly flat and may also have microstructure or features present. If features are present on the recessed flat bottom surface, it is preferred that the height of the microstructure be no greater than about 25% of the average depth of the recessed region.

Although illustrative embodiments have been described herein with reference to the accompanying drawings, it is to be understood that the present invention is not limited to those precise embodiments, and that various other changes and modifications may be effected by one skilled in the art without departing from the scope or spirit of the invention. All such changes and modifications are intended to be included within the scope of the invention defined by the appended claims.

What is claimed is:

1. An integrated circuit chip structure, comprising one or more semiconductor chips having a first major chip surface substantially parallel to and facing a first major cooling plate surface, wherein the respective first major chip surface and first major cooling plate surface are separated from each other by a layer of thermally conductive conformable material therebetween, and wherein the first major chip surface is completely provided with a discretely shaped recessed microstructure.

2. An integrated circuit chip structure, comprising one or more semiconductor chips having a flat major chip surface substantially parallel to and facing a first major cooling plate surface, wherein the respective first major chip surface and firt major cooling plate surface are separated from each other by a layer of thermally conductive conformable material therebetween, and wherein the first major chip surface is completely provided with a discretely shaped recessed microstructure comprising a repeating unit of adjacent recessed cells, within which cells slope-walled surfaces connect a recessed bottom surface with a projecting flat surface and wherein the slope-walled surfaces have an average slope of about 5 degrees to about 80 degrees.

3. The structure recited in claim 2, wherein the layer of thermally conductive conformable material is selected from the group consisting of thermal paste, thermal grease, phase-change material, particle-filled silicone, dry particle lubricant, and dry deformable metal particles.

4. The structure recited in claim 2, wherein the repeating unit of adjacent recessed cells covers a two-dimensional surface in which the minimum width between projecting adjacent flat surfaces is less than about 0.5 millimeters.

5. The structure recited in claim 2, wherein the recessed bottom surface is provided with a microstructure having a height less than about 25% of recessed cell depth.

6. The structure recited in claim 2, wherein the slope-walled surfaces have an average slope of about 30 degrees to about 70 degrees.

7. The structure recited in claim 2, wherein about 60% to about 99% of the area of the discretely shaped microstructure comprises recessed surfaces and sloped surfaces.

8. The structure recited in claim 2, wherein the longer dimension of the slope-walled cell is oriented parallel to a nearest chip edge.

9. An integrated circuit chip structure, comprising one or more semiconductor chips having a first major chip surface substantially parallel to and facing a first major cooling plate surface, wherein the respective first major chip surface and the first major cooling plate surface are separated from each other by a layer of thermally conductive conformable material therebetween, and wherein the first major cooling plate surface is provided with a discretely shaped recessed microstructure.

10. An integrated circuit chip structure, comprising one or more semiconductor chips having a first major chip surface substantially parallel to and facing a first major cooling plate surface, wherein the respective first major chip surface and the first major cooling plate surface are separated from each other by a layer of thermally conductive conformable material therebetween, and wherein the first major cooling plate surface is provided with a discretely shaped recessed microstructure comprising a repeating unit of adjacent recessed cells, within which cells slope-walled surfaces connect a recessed bottom surface with a projecting flat surface and wherein the slope-walled surfaces have an average slope of about 5 degrees to about 80 degrees.

11. The structure recited in claim 10, wherein the slope-walled surfaces feature a profile selected from the group consisting of curved, faceted, straight and any combination thereof.

12. The structure recited in claim 10, wherein the layer of thermally conductive conformable material is selected from the group consisting of thermal paste, thermal grease, phase-change material, particle-filled silicone, dry particle lubricant, and dry deformable metal particles.

13. The structure recited in claim 10, wherein the repeating unit of adjacent recessed cells covers a two-dimensional surface in which the minimum width between projecting adjacent flat surfaces is less than about 0.5 millimeters.

14. The structure recited in claim 10, wherein the recessed bottom surface is provided with a microstructure having a height less than about 25% of recessed cell depth.

15. The structure recited in claim 10, wherein the slope-walled surfaces have an average slope of about 30 degrees to about 70 degrees.

16. The structure recited in claim 10, wherein about 60% to about 99% of the discretely shaped microstructure comprises recessed surfaces and sloped surfaces, in region facing a first major chip surface.

17. The structure recited in claim 10, wherein the longer dimension of the slope-walled cell is oriented parallel to a nearest chip edge.

18. An integrated circuit chip structure, comprising one or more semiconductor chips having a first major chip surface substantially parallel to a first major cooling plate surface, wherein the respective first major chip surface and first major cooling plate surface are separated from each other by a heat spreader having a first surface facing the first surface of the one or more chip and a second surface facing toward the first surface of the cooling plate, wherein there is also a layer of thermally conductive conformable material between the heat spreader and the cooling plate, and wherein a discretely shaped recessed microstructure is provided on at least one of the second major surface of the heat spreader and the first major surface of the cooling plate.

19. A method for reducing the thermal resistance along the primary heat dissipation path from one or more chips in an integrated circuit chip package, comprising:
   a. providing a cooling plate having a first major surface;
   b. providing at least one semiconductor chip having a first major surface substantially parallel to the first major surface of the cooling plate;
   c. providing at least one of the first major surfaces with a discretely shaped recessed microstructure;
   d. providing between the first major surface having the discretely shaped recessed microstructure and the remaining first major surface a layer of conformable thermally conductive material containing particulate material in a range of sizes; and e. applying pressure to the layer of conformable thermally conductive material, causing the largest particles of the particulate material to be preferentially distributed into the discretely shaped recessed microstructure, thereby reducing the average thickness and the effective thickness of the layer of thermally conductive material.

20. A method for reducing the thermal resistance along the primary heat dissipation path from one or more chips in an integrated circuit chip package, comprising:

a. providing a cooling plate having a first major surface;

b. providing at least one semiconductor chip having a first major surface substantially parallel to the first major surface of the cooling plate;

c. providing at least one of the first major surfaces with a pattern of discretely shaped recessed microstructure comprising a repeating unit of adjacent slope-walled recessed cells;

d. providing a layer of conformable thermally conductive material between the first major surface having the discretely shaped recessed microstructure and the remaining first major surface a layer of conformable thermally conductive material containing particulate material in a range of sizes; and e. applying pressure to the layer of conformable thermally conductive material, causing the largest particles of the particulate material to be preferentially distributed into the discretely shaped recessed microstructure, thereby reducing the average thickness and the effective thickness of the layer of thermally conductive material.

21. The method recited in claim 20, wherein the step of providing at least one of the first major surfaces with a discretely shaped recessed microstructure comprises providing a first cooling plate surface with a discretely shaped recessed microstructure by a method selected from the group consisting of anisotropic wet etching, diamond ruling and electroforming.

22. The method recited in claim 20, wherein the step of providing at least one of the first major surfaces with a discretely shaped recessed microstructure comprises completely providing the at least one first major chip surface with a discretely shaped recessed microstructure by anisotropic wet etching.

23. The method recited in claim 20, wherein the step of providing a pattern comprising a repeating unit of adjacent slope-walled recessed cells comprises providing a pattern comprising a repeating unit of adjacent slope-walled recessed cells wherein about 60% to about 99% of each cell is comprised of recessed surfaces and sloped surfaces, in the region of the at least one of the first major surfaces which is in contact with a layer of conformable thermally conductive material, each of the cells having a minimum width of between about 5 microns and about 200 microns.

24. The method recited in claim 20, wherein the step of providing a discretely shaped recessed microstructure comprises providing a pattern comprising a repeating unit of adjacent recessed slope-walled cells, wherein the angle of slope is between about 30 degrees to about 80 degrees.

25. A method for reducing the thermal resistance along the primary heat dissipation path from one or more chips in an integrated circuit package, comprising:

a. providing a cooling plate having a first major surface;

b. providing at least one semiconductor chip having a first major surface substantially parallel to the first major surface of the cooling plate;

c. providing between the cooling plate and the at least one chip a heat spreader having a first surface facing the first major surface of the at least one chip and a second surface facing toward the first surface of the cooling plate;

d. providing a layer of thermally conductive conformable material between the heat spreader and the cooling plate; and e. providing a discretely shaped recessed microstructure on at least one of the second major surface of the heat spreader and the first major surface of the cooling plate.

26. A method for reducing the migration of a conformable thermally conductive material in an integrated circuit chip package, comprising:

a. providing a cooling plate having a first major surface;

b. providing at least one semiconductor chip having a first major surface substantially parallel to the first major surface of the cooling plate;

c. providing at least one of the first major surfaces with a discretely shaped recessed microstructure;

d. providing between the first major surface having the discretely shaped recessed microstructure and the remaining first major surface a layer of conformable thermally conductive material containing particles in a range of sizes; and e. applying pressure to the layer of conformable thermally conductive material, causing the largest particles in the range of sizes to be preferentially distributed into the discretely shaped recessed microstructure, thereby reducing the average thickness and the effective thickness of the layer of thermally conductive material.

27. A method for reducing the migration of a conformable thermally conductive material in an integrated circuit package, comprising:

a. providing a cooling plate having a first major surface;

b. providing at least one semiconductor chip having a first major surface substantially parallel to the first major surface of the cooling plate;

c. providing between the cooling plate and the at least one chip a heat spreader having a first surface facing the first major surface of the at least one chip and a second surface facing toward the first surface of the cooling plate;

d. providing a layer of thermally conductive conformable material between the heat spreader and the cooling plate; and e. providing a discretely shaped recessed microstructure on at least one of the second major surface of the heat spreader and the first major surface of the cooling plate.

* * * * *